United States Patent [19]

Tsantrizos et al.

[11] Patent Number: 5,196,273
[45] Date of Patent: Mar. 23, 1993

[54] TANTALUM CARBIDE COMPOSITE MATERIALS

[75] Inventors: Peter Tsantrizos, Ville St-Pierre; Lakis T. Mavropoulos, Montreal; Kartik Shanker, Ile des Soeurs; Robin A. L. Drew, Pointe-Claire; Bruce Henshaw, Rigaud; Raynald Lachance, Pincourt, all of Canada

[73] Assignee: Noranda Inc., Toronto, Canada

[21] Appl. No.: 698,898

[22] Filed: May 13, 1991

[30] Foreign Application Priority Data

Sep. 18, 1990 [CA] Canada ............................ 2025619

[51] Int. Cl.$^5$ .......................................... C22C 29/00
[52] U.S. Cl. ................................................. 428/614
[58] Field of Search ................ 428/614, 545; 75/239; 419/17, 27

[56] References Cited

U.S. PATENT DOCUMENTS

| 1,918,212 | 7/1933 | Palmer | 419/27 |
|---|---|---|---|
| 2,922,721 | 1/1960 | Tarkan et al. | 428/545 |
| 3,553,820 | 2/1967 | Sara | 428/614 |
| 3,728,108 | 4/1973 | Sifferlen et al. | 420/1 |
| 4,469,654 | 9/1984 | Haskett et al. | 501/87 |
| 4,803,334 | 2/1989 | Burke et al. | 219/121.64 |

FOREIGN PATENT DOCUMENTS 39-22469  10/1964  Japan ................................ 75/239

Primary Examiner—Michael Lewis
Assistant Examiner—Ngoc-Yen M. Nguyen
Attorney, Agent, or Firm—Keck, Mahin & Cate

[57] ABSTRACT

A tantalum carbide composite material comprises a tantalum carbide preform infiltrated with a low melting temperature metal selected from aluminum, copper, various alloys of either aluminum or copper, gold and silver.

4 Claims, 3 Drawing Sheets

TANTALUM CARBIDE COMPOSITE MATERIALS

FIELD OF THE INVENTION

This invention relates to a tantalum carbide composite material developed for use as an electrode in high temperature/high current density applications. The material is especially suitable for plasma torches which use a reactive plasmagas. A new process for manufacturing this material is also disclosed.

BACKGROUND OF THE INVENTION

Electrode lifetime in general and cathode performance in particular has long been recognized as one of the most important considerations affecting the viability of a plasma process. Rapid electrode deterioration can diminish the value of a process both from an economic and a technical point of view. Consequently, parameters such as the frequency of reactor "down-time" for electrode replacement, the cost of electrodes, and the contamination of products with materials emitted from the electrodes, are crucial in determining the ultimate success of plasma technology. Of even greater importance is the stability of the plasma, which can be greatly affected by phenomena occurring on the surface of the cathode.

Early recognition of the importance of electrode phenomena has provided incentive for much research in this field during the past fifty years. Yet, despite this intensive effort, the phenomena occurring at the electrodes, and especially the cathode, remain one of the least understood areas of plasma science. Nonetheless, some theories have been developed and used with some success to explain empirically-attained data. Most of them begin by assuming a mechanism of electrode emission and assessing the state of the cathode surface during such emission. Two such theories have become dominant and have provided the scientific base for all electrode development to date. The two theories describe the mechanism of cathodic electron emission as follows:

1. For sufficiently high temperatures at the cathode surface and low field strength, the current can be carried mostly by electrons which have been thermally emitted from the cathode. This method of electron emission is commonly referred to as "thermionic emission" and is characterized by cathode surface temperatures above 3,000° C. and current densities of around $10^3$ to $10^4$ A/cm$^2$. Only refractory materials such as tungsten and carbon have high enough boiling points to allow for thermionic emission. These materials are referred to as thermionic emitters.

2. For sufficiently high field strength in front of the cathode surface, emission can occur at relatively low temperatures (below 2,700° C.), with the cathode material releasing electrons whose energy is below the Fermi level. This mechanism is commonly referred to as "field emission" and is characterized by current densities higher than $10^6$ A/cm$^2$. Non-refractory materials such as copper and aluminum are used in field emitting electrodes and are thus known as field emitters.

Today, most workers in the field agree that in real arcs one deals with a combination of thermionic and field emissions while a smaller ionic component is also active.

Perhaps influenced by the above theories, all electrode plasma torches (i.e. transferred arcs and d.c. arcs but not induction plasmas which are electrodeless torches) use either copper (a field emitter) or tungsten, carbon and molybdenum (thermionic emitters) for their cathode. Alloying elements, such as silver for copper and thoria for tungsten, are commonly used in concentrations up to 2%. These elements reduce the cathodes work function (a measure of the material's ability to emit electrons) thus allowing the cathode to operate at lower temperatures and minimum erosion rates.

Carbon electrodes do not include alloying elements. Thus, they have a relatively high work function (5.0 eV), exhibit high erosion rates and are referred to as a consumable electrode. The work function of tungsten is much lower at around 4.5 eV. However, pure tungsten would still erode rapidly in a plasma torch. The addition of 1% thoria can reduce the cathodic work function to below 3.0 eV allowing for a much more stable operation. Thoriated tungsten is the preferred cathode for thermionic emitting plasma torches.

The electrodes developed thus far provide low erosion rates and stable operations within a limited operating range. Most operate well at currents below 5,000 A and inert plasmagas. Copper alloys have been used successfully with oxygen as the plasmagas. Thoriated tungsten performs well in reducing plasmas (i.e. plasmas where $H_2$, $CH_4$, or $NH_4$ are used in the plasmagas). However, no electrode to date has been successful in producing a stable operation in highly reactive plasmas, especially halogens.

Metal halide gases (such as $TiCl_4$, $NbCl_5$, etc.) are extremely corrosive at high temperatures. Thus, when such gases are used as the plasmagas in a torch, they react extensively with the cathode material. These reactions are deleterious to the plasma stability not only due to the mass loss occurring at the electrode but also due to the production of reduced metals (such as Ti and Nb) which blanket the electrode, increase its work function and ultimately suffocate the electron emission process.

A stable electrode for plasma torches operating on metal halide plasmagas must not react with such gases even at the extremely high temperatures characteristic of the cathode's surface (around 3,700° C.). It must also posses a low work function, high melting and vaporizing temperatures, good thermal and electrical conductivity, and high resistance to thermal shock.

Tantalum carbide is a refractory material whose melting and boiling temperatures are 3,850° C. and 5,470° C. respectively. It also possesses an extremely low thermionic work function of around 3.8 eV. Compared to most ceramics, it is an excellent conductor with a room-temperature electrical resistivity of only 25 microhm-cm and a thermal conductivity of 21 W/(m.K). Finally, it is extremely resistant to chemical attack by the chlorides even at high temperatures.

Despite all the excellent properties of tantalum carbide, its performance as an electrode is rather unsatisfactory. It is highly susceptible to shattering upon arc ignition due to thermal shock. During operation, its thermal conductivity is too low to dissipate the enormous amount of energy absorbed at the electrodes, resulting in local melting. Due to its high melting temperature, it is a difficult material to sinter to high volume fraction %. Volume fraction % of only 50–65% were achieved by sintering for half hour at temperatures up to 2,000° C. The volume fraction % can be increased to 75–80% by sintering for half hour at temperatures over 2,400° C. The material at low volume fraction % has poor strength and significantly reduced electrical and thermal conductivities, further contributing to the shattering and melting observed upon arc ignition. Finally, the material is very hard and brittle making it very difficult to shape into useful electrodes.

SUMMARY OF THE INVENTION

All of the shortcomings associated with pure TaC electrodes have been eliminated, in accordance with the present invention, by providing a tantalum carbide composite material prepared by infiltrating tantalum carbide preform with a relatively low melting temperature metal possessing complementary properties to the ceramic (i.e. high thermal shock resistance, high thermal and electrical conductivities, and good electron emitting properties). Aluminum and copper have been used as the infiltrating material. Various alloys of either aluminum or copper can also be used. Other metals, such as gold and silver, may also be used. To increase the ceramic content of the composite material, the TaC preform should be sintered prior to infiltration.

The invention will now be disclosed, by way of example with reference to the accompanying drawings in which:

DETAILED DESCRIPTION OF THE PREFERRED EMBODIMENT

Figure 1:
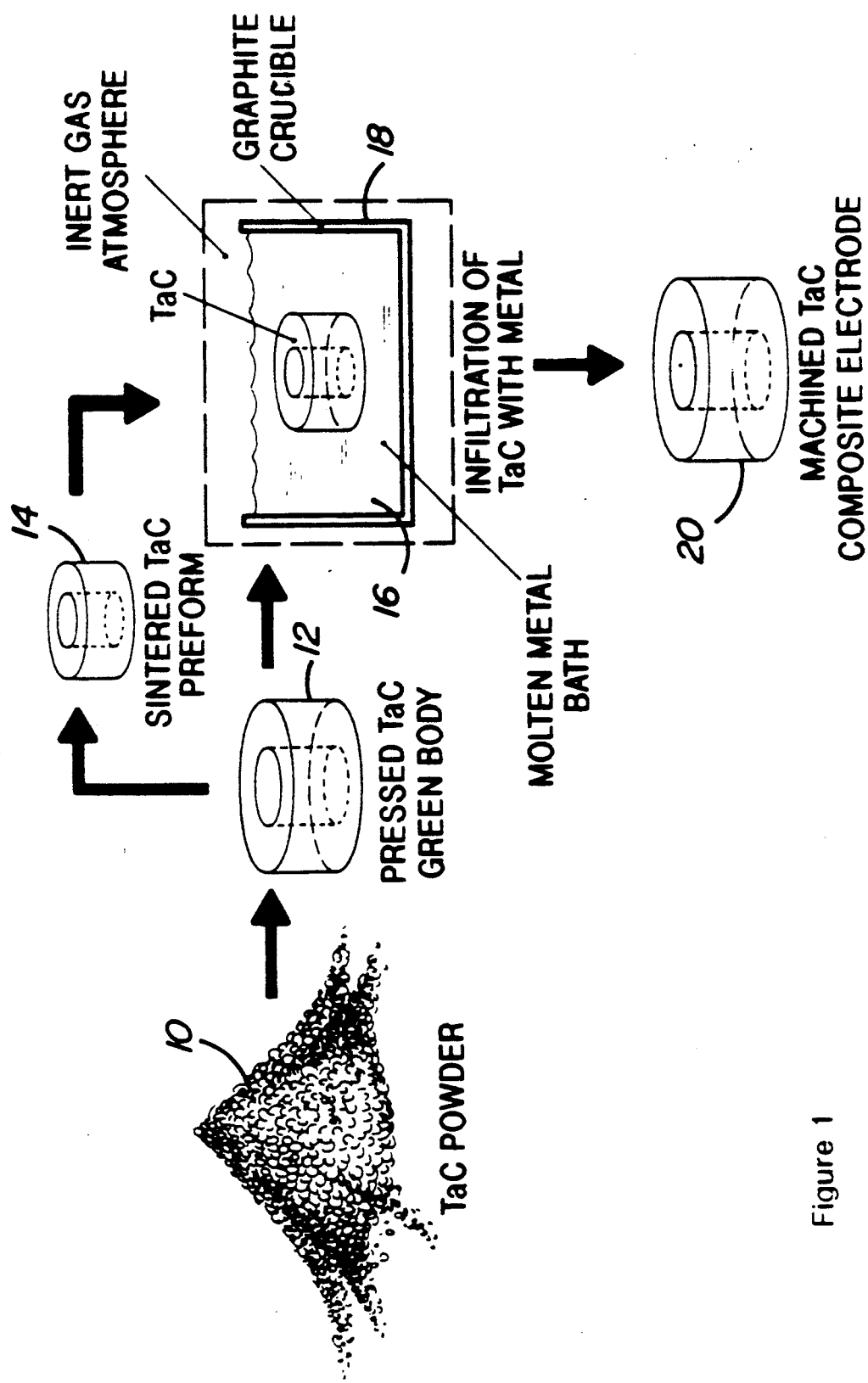
FIG. 1 is a flow sheet of a process in accordance with the invention for manufacturing a TaC composite material.

Referring to FIG. 1, TaC powder 10 about 1 $\mu$ in size is pressed to form a TaC green body 12. The green body can then be sintered for $\frac{1}{2}$ hr. at a temperature between 1,900° C. and 2,500° C. to form a TaC sintered preform 14. The volume fraction % of the TaC preform after sintering is preferably from around 50% to over 80% and the preform is preferably reduced in size accordingly. Infiltration of non-sintered green bodies is also possible if high ceramic volume fraction % are not required. The infiltration can be accomplished by heating the TaC preform in a molten metal bath 16 at temperatures above 1,100° C. and below 2,000° C. The optimum temperature for infiltration appears to be around 1,500° C. A graphite crucible 18 maintained under an inert gas atmosphere was used to contain the molten bath. The resulting TaC composite material was machined to the shape of an electrode 20 which had excellent properties relevant to its application as an electrode in a plasma torch.

Two examples of TaC composite electrodes were manufactured and tested. The first composite used aluminum as the infiltrating metal, whereas copper was used in the second. Both composites were very strong, had good thermal and electrical conductivities, were highly resistant to thermal shock (no cracking was observed upon arc ignition), and were easily machinable to desired shapes. Some properties of these materials are listed in the following Table I.

TABLE I

| Properties of TaC Composite Materials | | |
|---|---|---|
| Material Composition | TaC/Al | TaC/Cu |
| Ceramic Volume Fraction (%) | 55 | 52 |
| Electrical Resistivity ($\Omega \cdot$ cm) | $9.6 \times 10^{-6}$ | $4.4 \times 10^{-6}$ |
| Thermal Diffusivity (cm/sec @ 18° C.) | 0.275 | 0.284 |
| Yield Strength (0.1%, MPa) | 80 | 130 |
| Tensile Strength (MPa) | 435 | 400 |
| Elongation (%) | 9 | 8.7 |
| Compressive Strength (MPa) | 600 | 1380 |
| Hardness (R-A, 60 kg) | 53 | 63 |
| Machinability | excellent | excellent |

Figure 2A:
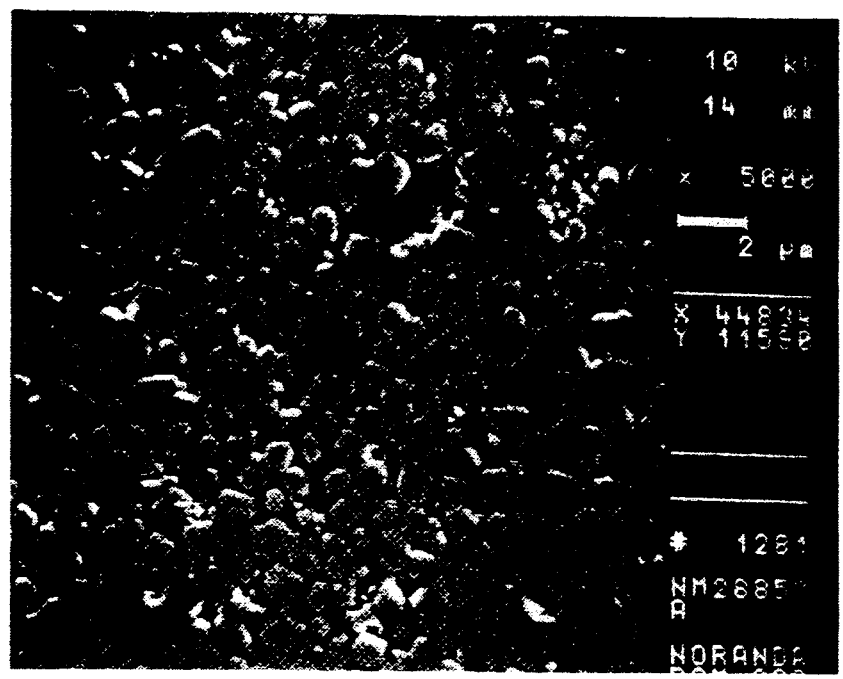
FIGS. 2a and 2b show Scanning Electron Microscope photographs depicting the microstructure of the TaC composite material made.
Figure 2B:
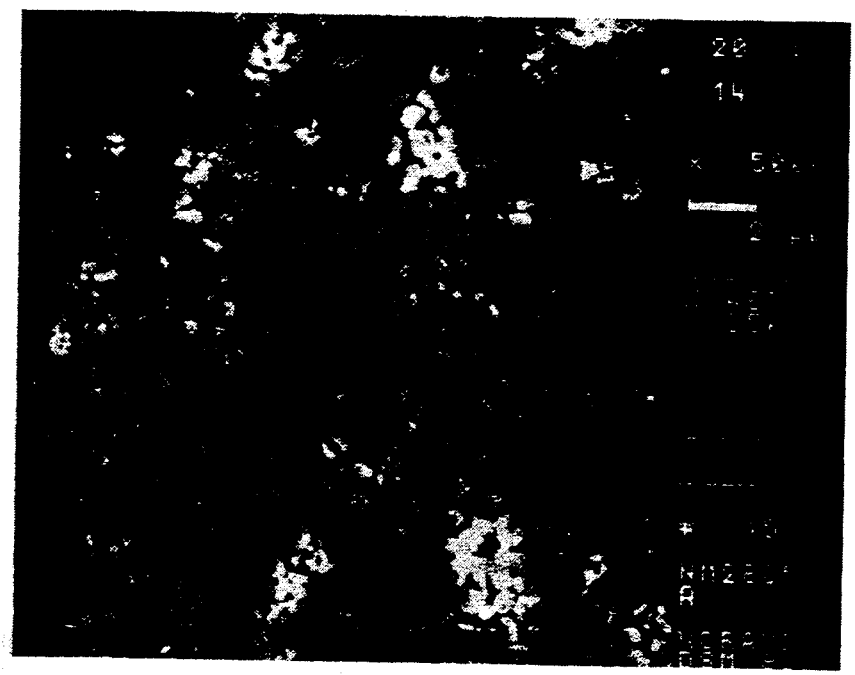

Scanning Electron Microscope photographs depicting the microstructure of each material are shown in FIGS. 2a and 2b.

Figure 3:
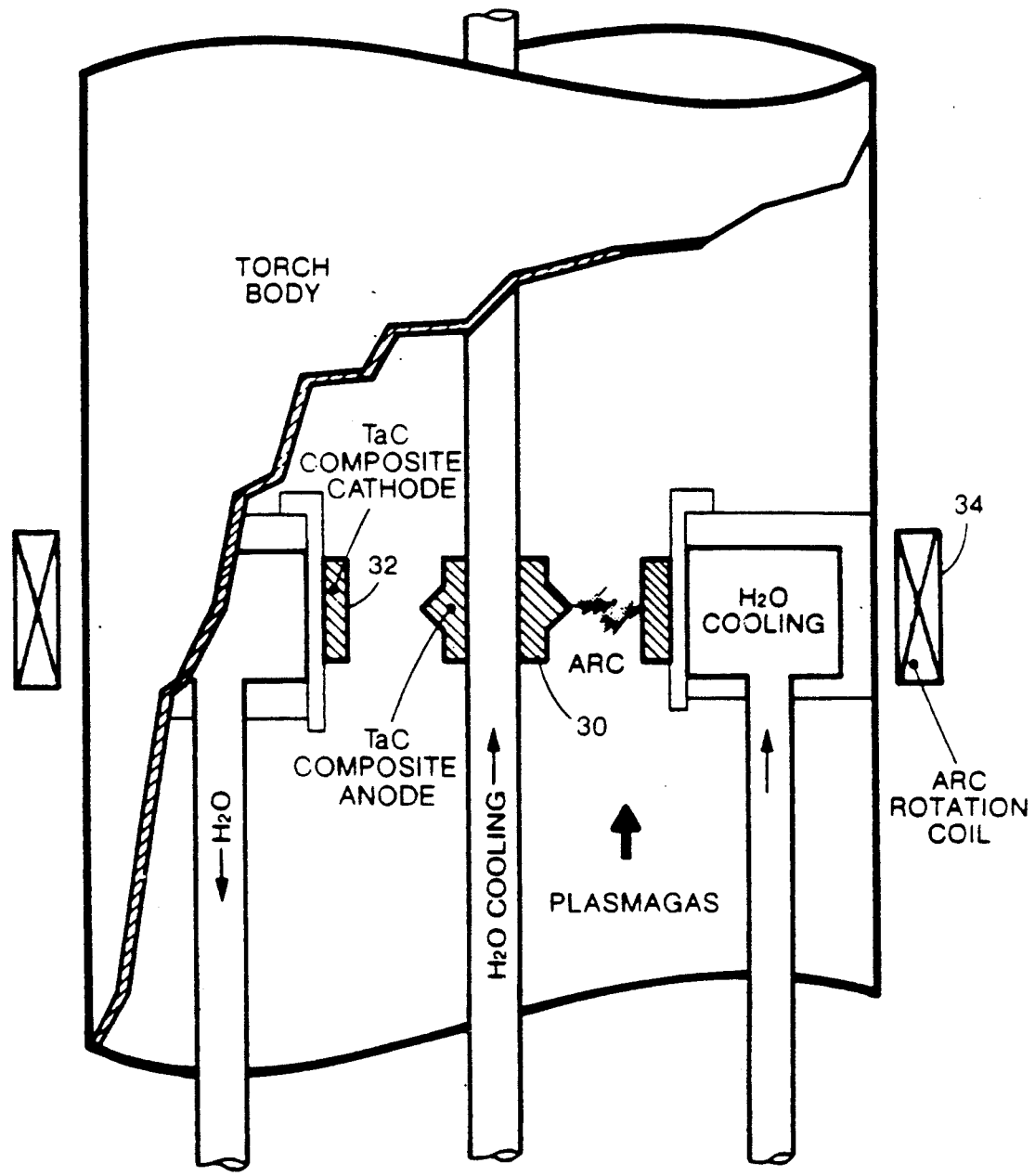
FIG. 3 is a diagram of a plasma torch using the TaC composite material in accordance with the present invention.

The composite materials were made into electrodes (both anode and cathode) and tested in a plasma torch, shown schematically in FIG. 3. The arc is operated between a TaC composite anode 30 and a TaC composite cathode 32 and rotated using a magnetic coil 34. The plasmagas flows radially through the electrodes' region. H$_2$O is used for cooling the electrodes. Two plasmagas compositions were used for the tests. Pure argon plasmagas was used to assess the cathode's performance in an inert plasma, and argon containing 10–15% TiCl$_4$ plasmagas was used to assess the electrodes' performance in a metal halide plasma. The performance of the new electrode materials were quite satisfactory. Stable operation and low erosion rates were observed under all experimental conditions investigated. Four examples of operating data, including electrode erosion data, are reported below:

EXAMPLE 1

| | |
|---|---|
| PURPOSE: | To evaluate the performance of TaC/Al composite electrodes in a plasma torch, using inert plasmagas. |
| Plasmagas: | Argon at 8 L/min |
| Duration : | 60 minutes |
| Arc Voltage: | 30 Volts |
| Arc Current: | 100 Amps |
| Arc Rotation: | 900 rpm |
| Anode Erosion Rate: | 0.55 $\mu$g/Coulomb |
| Cathode Erosion Rate: | 1.3 $\mu$g/Coulomb |

EXAMPLE 2

| | |
|---|---|
| PURPOSE: | To evaluate the performance of TaC/Al composite electrodes in a plasma torch, using reactive plasmagas. |
| Plasmagas: | 15 L/min Argon + 23 g/min TiCl$_4$ |
| Duration: | 20 minutes |
| Arc Voltage: | 50 Volts |
| Arc Current: | 100 Amps |
| Arc Rotation Period: | 900 rpm |
| Anode Erosion Rate: | 6.6 $\mu$g/Coulomb |
| Cathode Erosion Rate: | 25 $\mu$g/Coulomb |

EXAMPLE 3

| | |
|---|---|
| PURPOSE: | To evaluate the performance of TaC/Cu composite electrodes in a plasma torch, using inert plasmagas. |
| Plasmagas: | Argon at 15 L/min |
| Duration: | 20 minutes |
| Arc Voltage: | 26 Volts |

-continued

| | |
|---|---|
| Arc Current: | 100 Amps |
| Arc Rotation Period; | 1200 rpm |
| Anode Erosion Rate: | 0.28 μg/Coulomb |
| Cathode Erosion Rate: | 0.40 μg/Coulomb |

EXAMPLE 4

| | |
|---|---|
| PURPOSE: | To evaluate the performance of TaC/Cu composite electrodes in a plasma torch, using reactive plasmagas. |
| Plasmagas: | 15 L/min Argon + 15 g/min TiCl4 |
| Duration: | 10 minutes |
| Arc Voltage: | 42 Volts |
| Arc Current: | 100 Amps |
| Arc Rotation Period: | 1100 rpm |
| Anode Erosion Rate: | 3.4 μg/Coulomb |
| Cathode Erosion Rate: | 16 μg/Coulomb |

We claim:

1. A stable electrode for plasma torches operating on reactive plasmagas, comprising a composite made by infiltrating a metal having a low melting temperature selected from the group consisting of aluminum, copper, gold, silver and various alloys thereof into a preform consisting of a sintered body of tantalum carbide having a volume fraction % form over 50% to about 80%.

2. A stable electrode for plasma torches as defined in claim 1 wherein the preform is sintered prior to being infiltrated to increase the content of the TaC material.

3. A stable electrode for plasma torches as defined in claim 1 wherein the low melting temperature metal is aluminum.

4. A stable electrode for plasma torches as defined in claim 1 wherein the low melting temperature metal is copper.

* * * * *